(12) United States Patent
Nam

(10) Patent No.: US 7,371,636 B2
(45) Date of Patent: May 13, 2008

(54) METHOD FOR FABRICATING STORAGE NODE CONTACT HOLE OF SEMICONDUCTOR DEVICE

(75) Inventor: Ki-Won Nam, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/580,743

(22) Filed: Oct. 12, 2006

(65) Prior Publication Data
US 2007/0161182 A1    Jul. 12, 2007

(30) Foreign Application Priority Data
Dec. 14, 2005  (KR) .................. 10-2005-0123470
Sep. 11, 2006  (KR) .................. 10-2006-0087607

(51) Int. Cl.
*H01L 21/8242* (2006.01)
*H01L 21/8238* (2006.01)

(52) U.S. Cl. ............... 438/254; 438/210; 438/253; 438/397; 438/597; 257/E21.267

(58) Field of Classification Search .......... 438/210, 438/253, 254, 397, 597; 257/E21.267
See application file for complete search history.

(56) References Cited

U.S. PATENT DOCUMENTS 6,368,979 B1 *  4/2002  Wang et al. ............... 438/723

2003/0203510 A1 * 10/2003 Hineman et al. ............ 438/3
2004/0023508 A1 *  2/2004 Chinn et al. ............. 438/710
2005/0153535 A1 *  7/2005 Hwang et al. ............ 438/622
2006/0246711 A1 * 11/2006 Lahr et al. ............... 438/622
2006/0292498 A1 * 12/2006 Hwang et al. ............ 430/316

FOREIGN PATENT DOCUMENTS

| KR | 1998-0005510 | 3/1998 |
| KR | 1999-0075146 | 10/1999 |
| KR | 2003-0000695 | 1/2003 |

* cited by examiner

*Primary Examiner*—Scott B. Geyer
*Assistant Examiner*—Seahvosh Nikmanesh
(74) *Attorney, Agent, or Firm*—Blakely, Sokoloff, Taylor & Zafman

(57) ABSTRACT

A method for fabricating a storage node contact hole of a semiconductor device includes: forming an inter-layer insulation layer over a substrate; forming a hard mask over the inter-layer insulation layer; etching the inter-layer insulation layer to form a storage node contact hole; forming a passivation layer to fill the storage node contact hole; removing the hard mask with an etch rate of the hard mask faster than that of the inter-layer insulation layer; and removing the passivation layer.

19 Claims, 5 Drawing Sheets

METHOD FOR FABRICATING STORAGE NODE CONTACT HOLE OF SEMICONDUCTOR DEVICE

CROSS-REFERENCE TO RELATED APPLICATIONS

The present application contains subject matter related to the Korean patent application nos. KR 2005-0123470 and KR 2006-0087607, filed in the Korean Patent Office on Dec. 14, 2005 and Sep. 11, 2006, respectively, the entire contents of which being incorporated herein by reference.

FIELD OF THE INVENTION

The present invention relates to a method for fabricating a semiconductor device, and more particularly, to a method for fabricating a storage node contact hole.

DESCRIPTION OF RELATED ARTS

As the dimensions of a dynamic random access memory (DRAM) device are reduced, a thickness of a photoresist layer used as a mask to form a contact hole has been decreased as well. Accordingly, there is a lack of the photoresist layer during performance of an etching process. Recently, a contact hole is formed using a hard mask to overcome this limitation.

During an etching process of a storage node contact hole in a capacitor formation process of the DRAM, the hard mask is mainly formed using a polysilicon layer. A storage node contact plug to connect a landing plug formed in a lower portion of the storage node contact hole with a storage node of a capacitor fills the storage node contact hole.

However, the polysilicon layer used as the hard mask induces a mask alignment during forming a subsequent storage node contact plug and thus, an additional process opening a storage node contact key box is required. Also, the polysilicon thin film exposed to an entire surface of a wafer may be used as a particle source during a cleaning process repeatedly performed. Furthermore, moisture ($H_2O$) including a hydrogen component exists inside an inter-layer insulation layer. The polysilicon layer remaining during forming the polysilicon layer used as a subsequent storage node contact plug acts as a barrier which blocks $H_2O$ coming off to the outside. As a result, $H_2O$ expands to a substrate to change a threshold voltage property of a transistor. Accordingly, the hard mask needs to be removed after the storage node contact hole is formed.

FIGS. 1A to 1C are cross-sectional views illustrating a typical method for fabricating a storage node contact hole.

As shown in FIG. 1A, an inter-layer insulation layer 12 is formed over an upper portion of a substrate 11 in which a transistor, a landing plug and a bit line BL are formed. A hard mask polysilicon layer is formed over the inter-layer insulation layer 12.

A storage node contact mask 14 is formed over the hard mask polysilicon layer. The storage node contact mask 14 includes a photoresist layer.

The hard mask polysilicon layer is etched using the storage node contact mask 14 as an etch barrier to obtain a hard mask 13. The hard mask 13 includes polysilicon.

As shown in FIG. 1B, the inter-layer insulation layer 12 is etched using the storage node contact mask 14 and the hard mask 13 as an etch barrier to form a plurality of storage node contact holes 15. When the storage node contact holes 15 are formed, the storage node contact mask 14 may be removed, and the hard mask 13 performs a role of the etch barrier. After the storage node contact holes 15 are formed, a predetermined thickness of the hard mask 13 is damaged in the cell region. Hereinafter, the remaining hard mask after the storage node contact holes 15 are formed will be denoted with a reference numeral 13A.

However, a thickness D1 of the remaining hard mask 13A in the cell region where the storage node contact holes 15 are formed is different from a thickness D2 of the remaining hard mask 13A in the peripheral region.

As shown in FIG. 1C, the remaining hard mask 13A is removed.

If the remaining hard mask 13A formed with an unequal thickness is removed after the storage node contact holes 15 are formed, the inter-layer insulation layer 12 may be damaged in the cell region. The damaged portion of the inter-layer insulation layer 12 is denoted with a reference numeral 12A (see FIG. 1C).

For instance, if the hard mask 13 is initially formed with a thickness of approximately 1,200 Å, the thickness D1 of the remaining hard mask 13A in the cell region is approximately 600 Å and the thickness D2 of the remaining hard mask 13A in the peripheral region is approximately 900 Å. After the remaining hard mask 13A is removed, the damage portion 12A of the inter-layer insulation layer 12 is approximately 300 Å or greater. Also, when the remaining hard mask 13A is removed, inner portions and top portions of the storage node contact holes 15 may be damaged.

As described above, the damaged portion 12A of the inter-layer insulation layer 12 may increase parasitic capacitance between a bit line and a storage node or induce an electric short circuit between a bit line and a storage node contact plug.

SUMMARY OF THE INVENTION

It is, therefore, an object of the present invention to provide a method for fabricating a storage node contact hole of a semiconductor device capable of removing a hard mask and minimizing an excessive damage on an inter-layer insulation layer during removing the hard mask after a storage node contact hole is formed.

In accordance with one aspect of the present invention, there is provided with a method for fabricating a storage node contact hole of a semiconductor device, including: forming an inter-layer insulation layer over a substrate; forming a hard mask over the inter-layer insulation layer; etching the inter-layer insulation layer to form a storage node contact hole; forming a passivation layer to fill the storage node contact hole; removing the hard mask with an etch rate of the hard mask faster than that of the inter-layer insulation layer; and removing the passivation layer.

In accordance with another aspect of the present invention, there is provided with a method for fabricating a storage node contact hole of a semiconductor device, including: forming an oxide layer over a substrate defined as a cell region an a peripheral region; forming a silicon rich oxynitride (SRON) layer including a large amount of silicon over the oxide layer; etching the oxide layer using the SRON layer as a hard mask to form a storage node contact hole in the cell region; forming a passivation layer filling the storage node contact hole; removing the SRON layer with an etch rate of the SRON layer faster than that of the oxide layer; and removing the passivation layer.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

FIGS. 2A to 2F are cross-sectional views illustrating a method for fabricating a storage node contact hole in accordance with an embodiment of the present invention.

Figure 1A:
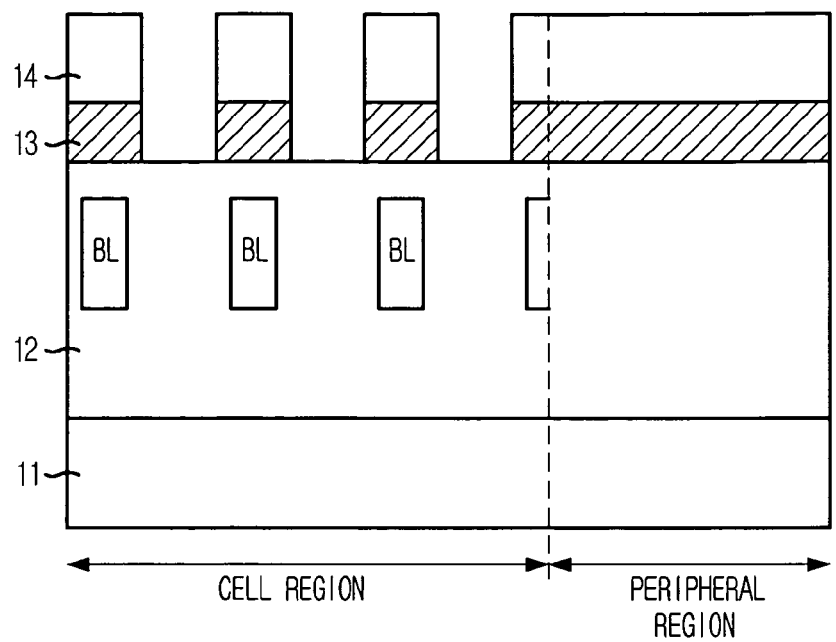
FIGS. 1A to 1C are cross-sectional views illustrating a typical method for fabricating a storage node contact hole.
Figure 1B:
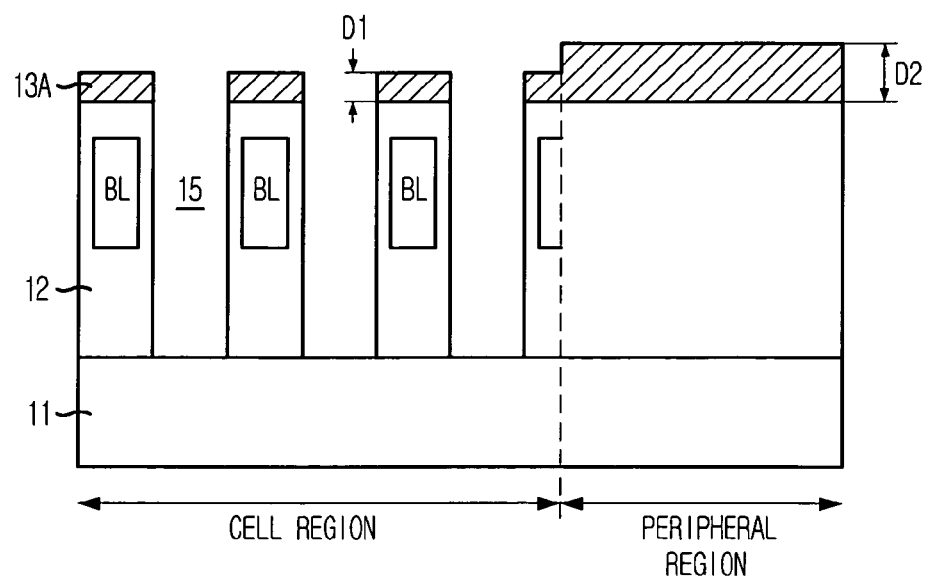
Figure 1C:
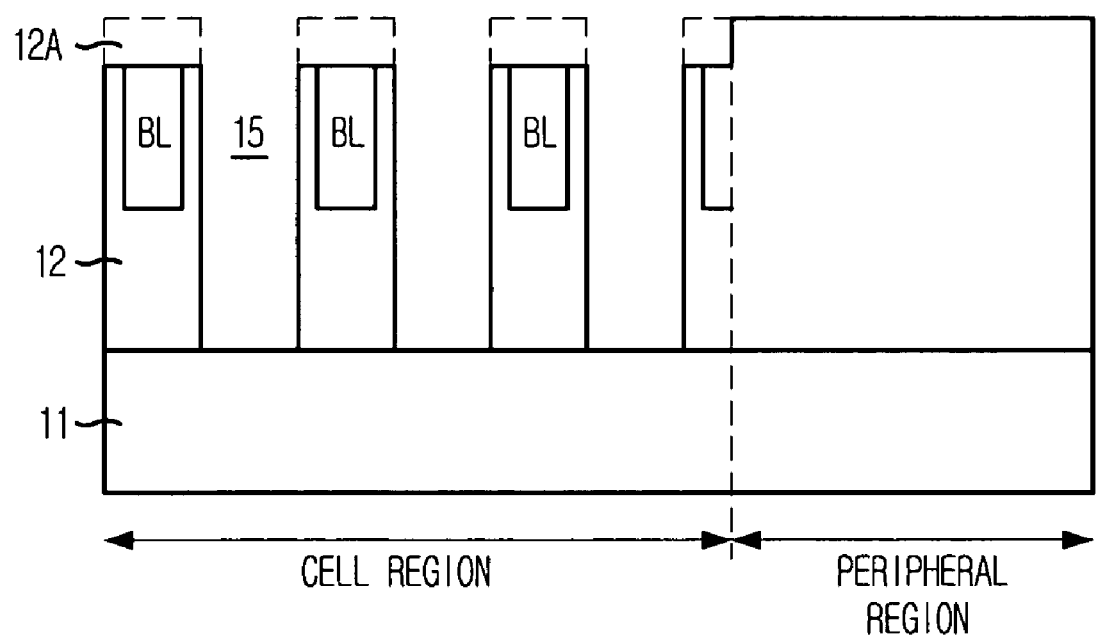
Figure 2A:
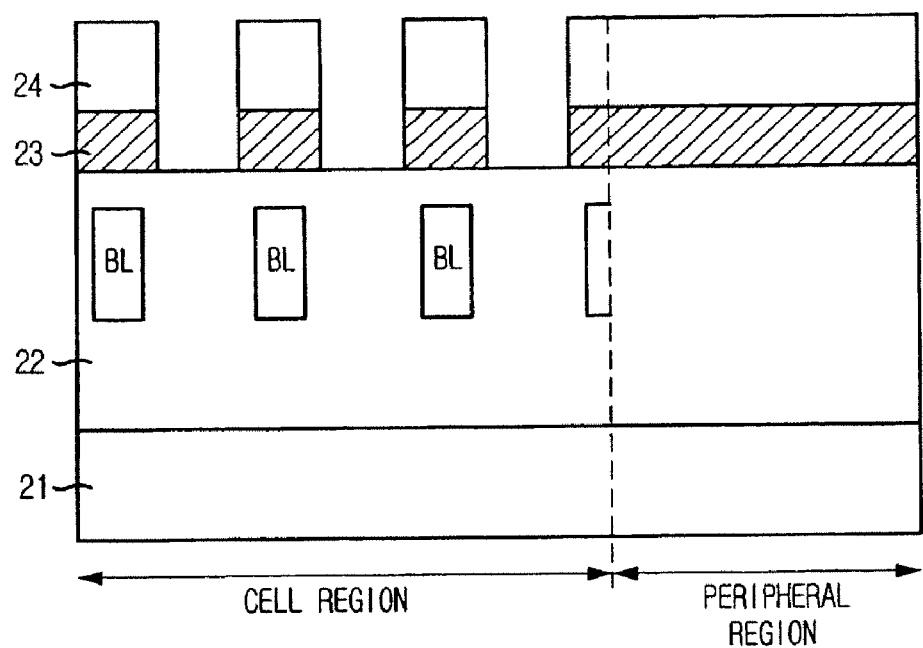
FIGS. 2A to 2F are cross-sectional views illustrating a method for fabricating a storage node contact hole in accordance with an embodiment of the present invention.

As shown in FIG. 2A, an inter-layer insulation layer 22 is formed over an upper portion of a substrate 21 defined as a cell region and a peripheral region. The inter-layer insulation layer 22 includes an oxide-based material. The oxide-based material can be one of a high density plasma oxide layer and a borophosphosilicate glass (BPSG) layer. The substrate 21 has been formed with a transistor including a word line, a landing plug and a bit line, and can be regarded as the landing plug. Accordingly, it can be assumed that the inter-layer insulation layer 22 is a multiple layered structure and the bit line BL is formed in the inter-layer insulation layer 22.

A hard mask layer is formed over the inter-layer insulation layer 22. The hard mask layer includes one selected from a group consisting of an oxide layer, a silicon nitride ($Si_3N_4$) layer, a polysilicon layer and a silicon rich oxynitride (SRON) layer including a large amount of silicon. Particularly, the hard mask layer mostly includes the SRON layer. The SRON layer has a larger amount of silicon than the $Si_3N_4$ layer and the nitride layer, so that the SRON layer has a better self aligned contact (SAC) etch property than the $Si_3N_4$ layer and the nitride layer. Also, using the SRON layer as the hard mask layer makes it easier to control selectivity with the inter-layer insulation layer 22 than using the polysilicon layer. Accordingly, damage on the inter-layer insulation layer 22 can be minimized during a subsequent removing process.

A storage node contact mask 24 is formed over the hard mask layer. The storage node contact mask 24 includes a photoresist layer. Afterwards, the hard mask layer is etched using the storage node contact mask 24 as an etch barrier to obtain a hard mask 23.

Figure 2B:
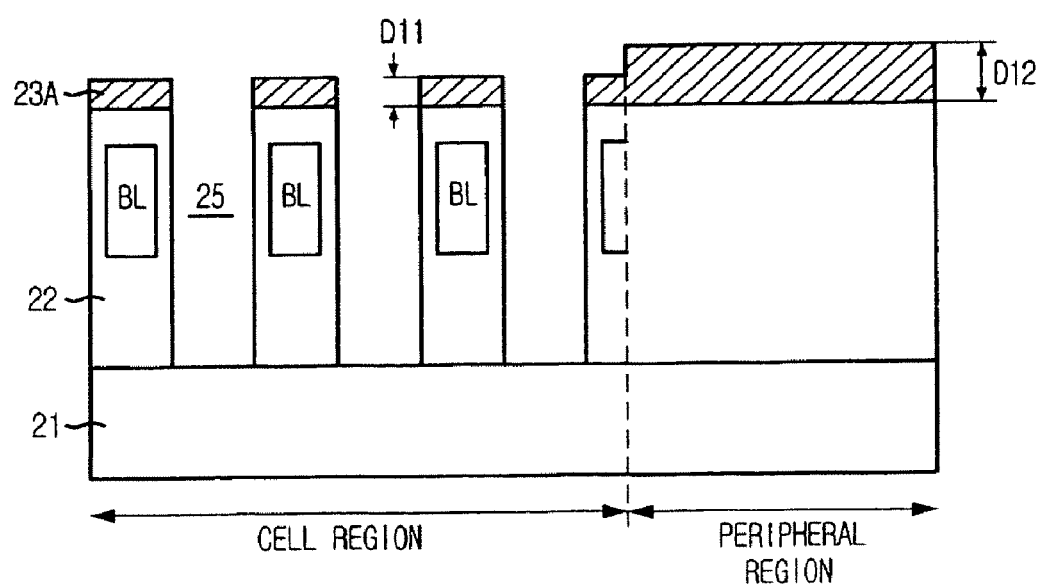

As shown in FIG. 2B, the inter-layer insulation layer 22 is etched using the storage node contact mask 24 and the hard mask 23 as an etch barrier to form a plurality of storage node contact holes 25 exposing surfaces of the substrate 21. When the storage node contact holes 25 are formed, the storage node contact mask 24 may be removed; however, the hard mask 23 performs a role of an etch barrier. During forming the storage node contact holes 25, the hard mask 23 uses the SRON layer including a large amount of polysilicon and thus, has an excellent SAC etch property. Accordingly, damage on a top portion of the hard mask 23 can be minimized. If the hard mask 23 has a poor SAC etch property, the top portion of the hard mask 23 can be etched during an etching process performed to form the storage node contact holes 25. As a result, damage over the top portion of the hard mask 23 can induce a defect of the storage node contact holes 25.

When the storage node contact holes 25 are formed, a part of the hard mask 23 is also damaged, so that the hard mask 23 remains with a predetermined thickness over the inter-layer insulation layer 22. Hereinafter, the remaining hard mask will be denoted with a reference numeral 23A. Accordingly, a thickness D11 of the remaining hard mask 23A in the cell region is different from a thickness D12 of the remaining hard mask 23A in the peripheral region. Since the storage node contact holes 25 are formed only in the cell region, the damage on the hard mask 23 is mainly generated in the cell region. As a result, the thickness D11 of the remaining hard mask 23A in the cell region becomes smaller than the thickness D12 of the remaining hard mask 23A in the peripheral region.

Figure 2C:
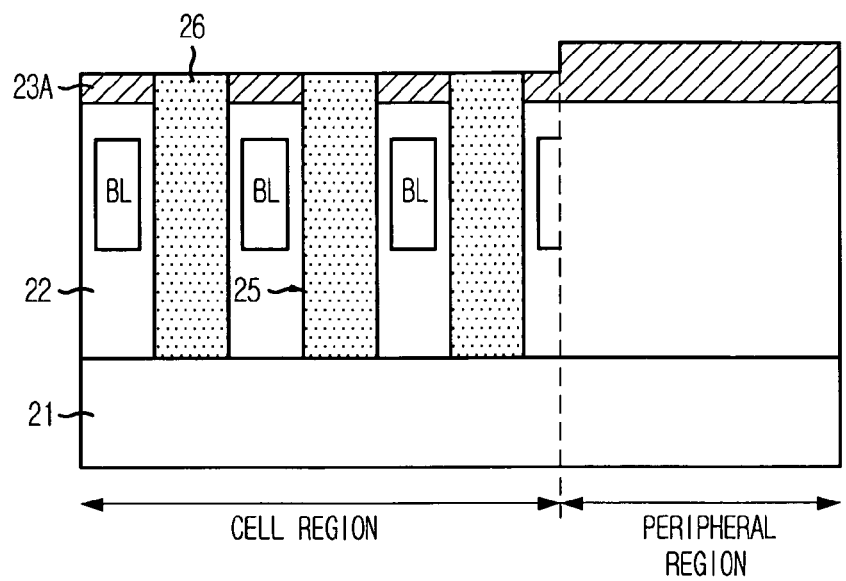

As shown in FIG. 2C, a passivation layer 26 is formed to fill the storage node contact holes 25 while the remaining hard mask 23A stays. The passivation layer 26 performs a role in preventing etch residues from being flowed into the storage node contact holes 25 during removing the remaining hard mask 23A. Also, the passivation layer 26 reduces damage on top portions of the storage node contact holes 25 during removing the remaining hard mask 23A.

The passivation layer 26 includes a photoresist layer and is formed through the following method to fill the storage node contact holes 25. The photoresist layer is formed over an entire surface of the above resulting structure until filling the storage node contact holes 25. Afterwards, a blanket exposure process is performed to remove the photoresist layer formed over the remaining hard mask 23A and to make the photoresist layer remain only inside the storage node contact holes 25.

Figure 2D:
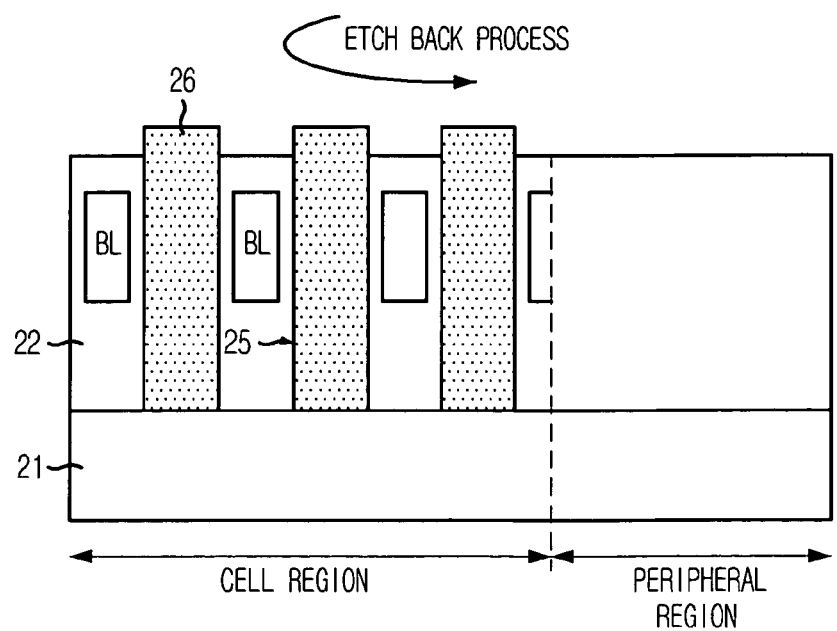

As shown in FIG. 2D, the remaining hard mask 23A is removed through an etch back process. When removing the remaining hard mask 23A, an etch rate of the remaining hard mask 23A is maintained faster than that of the inter-layer insulation layer 22 which is the oxide-based layer to reduce excessive damage on the inter-layer insulation layer 22. If the etch rate of the remaining hard mask 23A is maintained faster than the inter-layer insulation layer 22, the damage generated on the inter-layer insulation layer 22 can be minimized although the etch is excessively performed on the remaining hard mask 23A. For instance, the etch rate of the remaining hard mask 23A and the inter-layer insulation layer 22 is maintained at least approximately 2 parts of the remaining hard mask 23A to approximately 1 part of the inter-layer insulation layer or higher, i.e., approximately 2-3 parts of the remaining hard mask 23A to approximately 1 part of the inter-layer insulation layer.

The etching process of the remaining hard mask 23A formed of the SRON layer including a large amount of silicon will be examined in detail hereinafter.

The etching process to remove the remaining hard mask 23A uses the etch back process. The etch back process is performed in a reactive ion etching type plasma chamber using a gas obtained by adding an argon (Ar) gas as a dilution gas to a mixture gas of difluoromethane ($CH_2F_2$), methane ($CH_4$), and oxygen ($O_2$). A mixing ratio of the $CH_2F_2$ gas to the $CH_4$ gas to the $O_2$ gas is approximately 2 to approximately 1 to approximately 1. A total flow rate of the mixture gas of $CH_2F_2$, $CH_4$, and $O_2$ is approximately 80 sccm or less, i.e., approximately 50 sccm to approximately 80 sccm. The Ar gas has a flow rate ranging from approximately 100 sccm to approximately 1,000 sccm. If the total flow rate of the mixture gas of $CH_2F_2$, $CH_4$, and $O_2$ exceeds approximately 80 sccm, the inter-layer insulation layer 22 can be excessively etched. The inter-layer insulation layer 22 can be less etched if the flow rate of the $O_2$ gas is less than that of the $CH_2F_2$ gas in the mixture gas.

If using the above described recipe, the etch rate of the SRON layer including a large amount of silicon and the inter-layer insulation layer 22 is maintained at a ratio of approximately 2-3 parts of the SRON layer:approximately 1 part of the inter-layer insulation layer 22. Accordingly, the damage generated on the inter-layer insulation layer 22 in the cell region can be minimized until the SRON layer is completely removed.

As illustrated, the surface damage on the inter-layer insulation layer 22 can be minimized after the remaining hard mask 23A is removed. Also, during the etch back process to remove the remaining hard mask 23A, inner portions and the top portions of the storage node contact holes 25 are not damaged by the passivation layer 26.

Figure 2E:
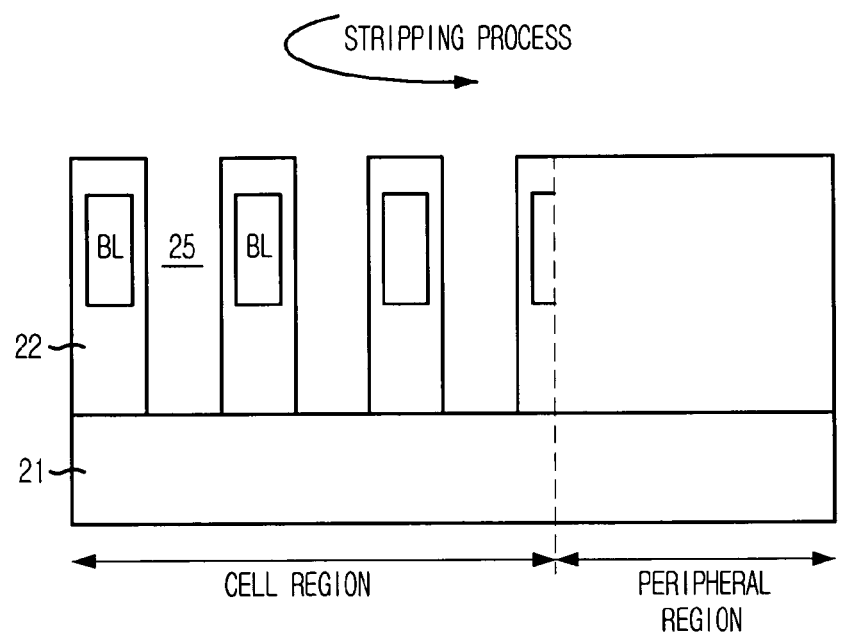

As shown in FIG. 2E, the passivation layer 26 filling the storage node contact holes 25 is removed. Since the passivation layer 26 includes the photoresist layer, the passivation layer 26 can be removed performing a stripping process using oxygen plasma. The inter-layer insulation layer 22 formed beside the passivation layer 26 has high selectivity to the oxygen plasma. Accordingly, an upper portion of the inter-layer insulation layer 22 cannot be damaged while the passivation layer 26 is removed.

Figure 2F:
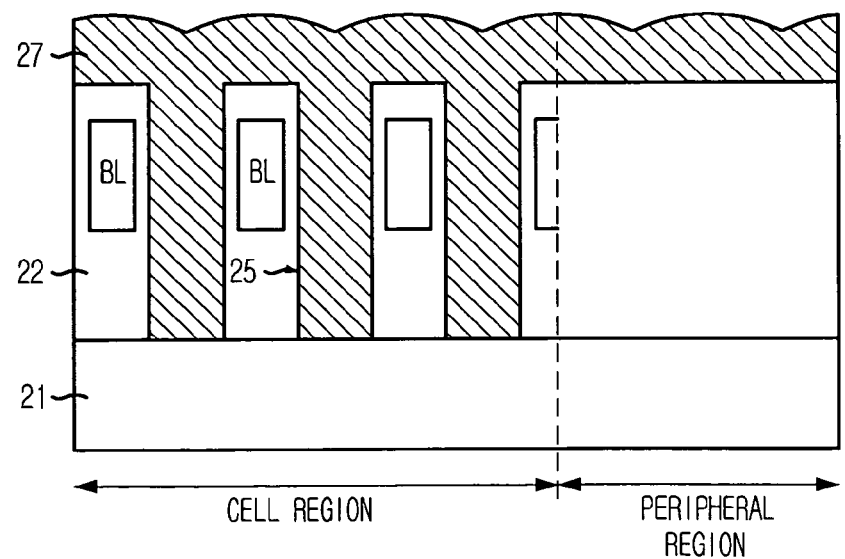

As shown in FIG. 2F, a polysilicon layer 27 is formed until filling the storage node contact holes 25 exposed after the passivation layer 26 is removed. Since the remaining hard mask 23A has been already removed before the polysilicon layer 27 is formed, moisture inside the inter-layer insulation layer 22 can come off to the outside. Accordingly, threshold voltage of a transistor does not vary due to the moisture.

Although not shown, the polysilicon layer 27 is selectively etched during a subsequent process, so that a storage node contact plug is formed.

As described above, the hard mask is removed by increasing etch selectivity between the inter-layer insulation layer and the hard mask. As a result, excessive damage on the inter-layer insulation layer in the cell region can be reduced. A thickness difference of the inter-layer insulation layer between in the peripheral region and in the cell region cannot be generated after the hard mask is removed. Also, the electric short circuit between the storage node contact plug and the bit line, and the parasitic capacitance between the storage node and the bit line can be reduced.

Although the formation of the storage node contact hole is exemplified in this embodiment of the present invention, this embodiment can be applied to any other cases using the hard mask during forming the contact hole of a semiconductor device. According to the embodiment of the present invention, the thickness difference of the inter-layer insulation layer between in the cell region and in the peripheral region can be minimized.

According to this embodiment of the present invention, the damage on the inter-layer insulation layer can be minimized using high etch selectivity between the inter-layer insulation layer and the hard mask after the storage node contact hole is formed. Also, a deformation of the storage node contact hole can be reduced. Furthermore, the hard mask is selectively etched before the storage node contact plug is formed, so that moisture inside the inter-layer insulation layer can be easily come off to the outside. Accordingly, threshold voltage of a transistor can be stable.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a storage node contact hole of a semiconductor device, comprising:
    forming an inter-layer insulation layer over a substrate;
    forming a hard mask over the inter-layer insulation layer;
    etching the inter-layer insulation layer to form a storage node contact hole;
    forming a passivation layer to fill only a volume of the storage node contact hole defined by the inter-layer insulation layer and the hard mask;
    removing the hard mask with an etch rate of the hard mask faster than that of the inter-layer insulation layer; and
    removing the passivation layer.

2. A method of claim 1, wherein the etch rate of the hard mask and the inter-layer insulation layer is maintained in a ratio of approximately 2-3 parts of the hard mask to approximately 1 part of the inter-layer insulation layer during the removing of the hard mask.

3. The method of claim 2, wherein the removing of the hard mask comprises using an etch back process.

4. The method of claim 1, wherein the passivation layer includes a photoresist layer.

5. The method of claim 4, wherein the forming of the passivation layer comprises:
    forming a photoresist layer over the inter-layer insulation layer until filling the storage node contact hole; and
    allowing the photoresist layer to remain only inside the storage node contact hole through performing a blanket exposure process.

6. The method of claim 5, wherein the removing of the passivation layer comprises performing a stripping process using oxygen plasma.

7. The method of claim 6, wherein the hard mask includes one of a silicon nitride layer and a polysilicon layer.

8. The method of claim 6, wherein the inter-layer insulation layer includes an oxide-based material.

9. The method of claim 6, wherein the substrate is defined as a cell region and a peripheral region, and the storage node contact hole is formed in the cell region.

10. A method for fabricating a storage node contact hole of a semiconductor device, comprising:
    forming an oxide layer over a semiconductor substrate defined as a cell region and a peripheral region;
    forming a silicon rich oxynitride (SRON) layer including a large amount of silicon over the oxide layer;
    etching the oxide layer using the SRON layer as a hard mask to form a storage node contact hole in that cell region;
    forming a passivation layer filling a volume of the storage node contact hole and being in contact with the semiconductor substrate;
    removing the SRON layer with an etch rate of the SRON layer faster than that of the oxide layer; and
    removing the passivation layer.

11. The method of claim 10, wherein the etch rate of the SRON layer and the oxide layer is maintained in a ratio of approximately 2-3 parts of the SRON layer to approximately 1 part of the oxide layer during the removing of the SRON layer.

12. The method of claim 11, wherein the removing of the SRON layer comprises using an etch back process.

13. The method of claim 12, wherein the etch back process comprises using a reactive ion etching type plasma chamber as an etch chamber.

14. The method of claim 13, wherein the etch back process comprises using a mixture gas including difluoromethane ($CH_2F_2$), methane ($CH_4$) and oxygen ($O_2$), and an argon (Ar) gas added to the mixture gas as a dilution gas.

15. The method of claim 14, wherein $CH_2F_2$, $CH_4$ and $O_2$ are mixed in a ratio of approximately 2 parts of $CH_2F_2$ to approximately 1 part of $CH_4$ to approximately 1 part of $O_2$.

16. The method of claim 14, wherein a total flow rate of $CH_2F_2$, $CH_4$ and $O_2$ ranges approximately 80 sccm or less; and a flow rate of the Ar gas ranges from approximately 100 sccm to approximately 1,000 sccm.

17. The method of claim 10, wherein the passivation layer includes a photoresist layer.

18. The method of claim 17, wherein the forming of the passivation layer comprises:

forming a photoresist layer over the oxide layer until filling the storage node contact hole; and allowing the photoresist layer to remain only inside the storage node contact hole through performing a blanket exposure process.

19. The method of claim 18, wherein the removing of the passivation layer comprises performing a stripping process using oxygen plasma.

\* \* \* \* \*

UNITED STATES PATENT AND TRADEMARK OFFICE
CERTIFICATE OF CORRECTION

| | |
|---|---|
| PATENT NO. | : 7,371,636 B2 |
| APPLICATION NO. | : 11/580743 |
| DATED | : May 13, 2008 |
| INVENTOR(S) | : Nam |

It is certified that error appears in the above-identified patent and that said Letters Patent is hereby corrected as shown below:

Title page, item [56], Under U.S. Patent Documents, line 5, please delete "Lahr" and insert -- Lehr --.

Signed and Sealed this

Ninth Day of December, 2008

JON W. DUDAS
*Director of the United States Patent and Trademark Office*